United States Patent [19]

Kakumoto et al.

[11] 4,293,171
[45] Oct. 6, 1981

[54] ANTI-FRICTION BEARING

[75] Inventors: Ken-Ichi Kakumoto, Kashihara; Yoshiki Fujita, Andomura, both of Japan

[73] Assignee: Koyo Seiko Company Limited, Osaka, Japan

[21] Appl. No.: 86,676

[22] Filed: Oct. 19, 1979

[30] Foreign Application Priority Data

Oct. 25, 1978 [JP] Japan .................................. 53-132041

[51] Int. Cl.³ ........................ F16C 19/02; F16C 33/32
[52] U.S. Cl. .................................... 308/188; 308/202; 308/241; 308/DIG. 8
[58] Field of Search ............... 308/188, 200, 202, 206, 308/241, DIG. 8, DIG. 9

[56] References Cited

U.S. PATENT DOCUMENTS

| Re. 18,908 | 8/1933 | Van Derhoef | 308/241 |
|---|---|---|---|
| 975,616 | 11/1910 | Hess | 308/200 |
| 2,477,139 | 7/1949 | Patton | 308/DIG. 8 |
| 3,078,548 | 2/1963 | Eubeler | 308/241 |
| 3,212,834 | 10/1965 | Mayer et al. | 308/188 |
| 3,425,759 | 2/1969 | Schwarzschild | 308/200 |
| 3,522,974 | 8/1970 | Polti | 308/241 |

FOREIGN PATENT DOCUMENTS

| 106519 | 1/1939 | Australia | 308/241 |
|---|---|---|---|
| 1525191 | 9/1969 | Fed. Rep. of Germany | 308/241 |
| 314736 | 8/1956 | Switzerland | 308/200 |
| 684556 | 12/1952 | United Kingdom | 308/DIG. 8 |

Primary Examiner—Richard R. Stearns
Attorney, Agent, or Firm—Mason, Fenwick & Lawrence

[57] ABSTRACT

Of the components of an anti-friction bearing, the metallic components to be subjected to rolling friction or sliding friction, such as rolling elements, are coated with a multiplicity of metal layers by ion plating. The uppermost layer is made of soft metal with lubricating property. The solid solubility of the metal of each intermediate layer in each adjacent metal is higher than the solid solubility of the soft metal in the metal material of the component.

1 Claim, 4 Drawing Figures

ANTI-FRICTION BEARING

BACKGROUND OF THE INVENTION

The present invention relates to anti-friction bearings adapted for use in a vacuum, for example, in rotating amode X-ray tube assembly, vacuum evaporation apparatus and like vacuum apparatus or in devices designed for travel in space.

Bearings for use in a vacuum involve difficulty in lubrication with oil or grease, so that in the prior art bearing components, such as rolling elements, are coated with a solid layer of a metal with lubricating property, molybdenum disulfide or like lubricant for lubricating the surface to be subjected to rolling friction or sliding friction. Generally such metal coatings are formed by the usual ion plating method as disclosed, for example, in Published Unexamined Japanese Patent Application No. 19840/1977.

However, the coatings formed by the conventional ion plating method have the drawbacks of being low in adhesive strength and therefore liable to separation in a short period of time during the operation of the bearing and giving a very short life to the bearing.

SUMMARY OF THE INVENTION

In view of the foregoing drawbacks, the main object of the present invention is to provide an anti-friction bearing which is serviceable for a prolonged period of time and in which, of the metal components thereof to be subjected to rolling friction or sliding friction, at least the rolling elements are each coated with a layer of a soft metal with lubricating property, the soft metal layer being formed by a novel ion plating method and having high adhesive strength.

To fulfil this object, the invention provides an anti-friction bearing comprising metal components to be subjected to rolling friction or sliding friction and including rolling elements, each of the rolling elements being coated with at least one intermediate metal layer by ion plating, the intermediate layer being coated by ion plating with an uppermost layer of a soft metal with lubricating property. The solid solubility of the metal of the intermediate layer in each metal adjacent thereto is higher than the solid solubility of the soft metal in the metal material of the rolling element.

These and other features of the invention will become apparent from the following description with reference to the accompanying drawings.

DESCRIPTION OF THE PREFERRED EMBODIMENTS

FIGS. 1 to 4 show the most preferred embodiments of this invention.

Figure 1:
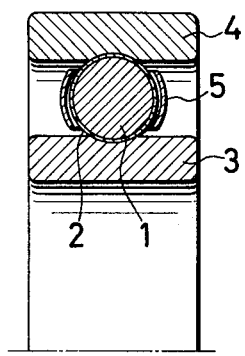
FIG. 1 is a view in vertical section showing an embodiment of the invention.

FIG. 1 shows a ball 1 serving as a rolling element, a composite coating 2 covering the surface of the ball 1, an inner ring 3 providing a raceway, an outer ring 4 providing another raceway and a cage 5 for retaining the ball 1.

Figure 2:
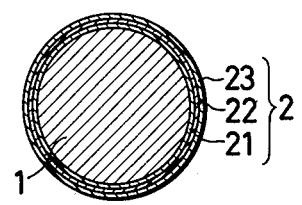
FIG. 2 is an enlarged sectional view showing a rolling element of FIG. 1.

As schematically shown in FIG. 2, the composite coating 2 comprises metal layers 21 and 22 formed as intermediate layers over the surface of the ball 1 by ion plating and an uppermost layer 23 made of a soft metal with lubricating property and formed over the layer 22 by ion plating. The solid solubility of the metal of each intermediate layer in each metal adjacent thereto is higher than the solid solubility of the soft metal in the metal material of the ball 1.

When the uppermost layer 23 is to be made, for example, from gold or silver which is known as a soft metal having a lubricating property, the ball 1 is cleaned and then ion-plated with nickel and thereafter with copper to form the intermediate layers 21 and 22, and the copper layer 22 is subsequently ion-plated with gold or silver to form the uppermost layer. The solid solubility of nickel or copper of each intermediate layer in each metal adjacent thereto is higher than the solid solubility of gold or silver in the metal material of the ball 1.

Gold, silver or like soft metal generally known to have a lubricating property has a low solid solubility in iron alloys used for bearing components, such as rolling elements, raceway rings and cages, as listed in Table 1, so that even when such iron alloy material is ion-plated directly with the soft metal, the resulting coating has low adhesive strength and is therefore prone to separation in a short period of time during the rotation of the bearing.

The solid solubilities of metals in other metals listed in Table 1 are those given in Dr. Phil. Max Hensen, "CONSTITUTION OF BINARY ALLOYS" (1958) and expressed in atomic percent (at. %).

TABLE 1

| Combination of metals | Solubility (at. %) |
|---|---|
| Silver in iron | 0–0.52 |
| Silver in copper | 0.06–4.9 |
| Copper in nickel | 100 |
| Nickel in iron | 7–9 |
| Gold in iron | 1.3–1.5 |
| Gold in copper | 20 |
| Silver in nickel | 1 |
| Gold in nickel | 2 |

In ion plating, the metal material to be plated and the plating metal undergo direct atom-to-atom reaction in an inert gas atmosphere, so that the adhesive strength of the plating layer is more dependent on the solid solubility of one metal in the other metal than is the case with other plating methods. It is further noted that gold or silver, a soft metal with lubricating property, has a low solid solubility in iron alloys which are widely used as materials for bearing components. In view of these properties, this invention contemplates provision of at least one intermediate metal layer between the material to be plated, namely, a bearing component and an uppermost plating layer of a metal having a good lubricating property although possessing a low solid solubility in the metal to be plated, the metal of the intermediate layer having a solid solubility in each metal adjacent thereto higher than the solid solubility of the plating metal, whereby the lubricating plating metal can be bonded to the bearing component with enhanced strength. Thus this invention successfully provides a long-life anti-friction bearing which is useful in special environment involving vacuums, super-low temperatures and high temperatures.

Table 2 shows the results of an experiment conducted with use of an anti-friction bearing embodying the invention, an anti-friction bearing coated by the conventional ion plating method and an anti-friction bearing having no plated component to test the bearings for service life.

TABLE 2

| Kind of specimen | Life ratio |
| --- | --- |
| Anti-friction bearing of the invention in which the rolling elements alone are ion-plated with Ni, then with Cu and thereafter with Au | 700 |
| Anti-friction bearing with its rolling elements alone ion-plated directly with Au by conventional method | 9 |
| Unplated usual anti-friction bearing | 1 |

The type of the bearings used for the experiment and the test conditions are as follows.

| Type of bearings: | Ball bearing No. 6000 |
| --- | --- |
| Test conditions: | |
| Temperature | room temperature |
| Pressure | $1 \times 10^{-5}$ torr or lower |
| Rotation | 200 r.p.m. |
| Thrust load | 48 kg |

Figure 3:
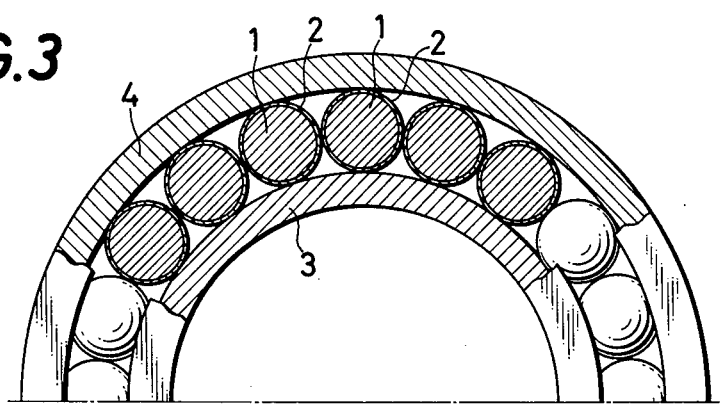
FIGS. 3 and 4 are front views partly broken away and showing other embodiments of the invention.

Table 3 shows the results of another experiment conducted with use of anti-friction bearings of the invention with a cage as seen in FIG. 1 or without any cage as shown in FIG. 3 to test the bearings for service life.

TABLE 3

| Type of bearing of the invention | | |
| --- | --- | --- |
| Plating | Cage | Life ratio |
| With rolling elements only ion-plated with Ni, then with Cu, thereafter with Au | None | 60 |
| With rolling elements only ion-plated with Ni, then with Cu, thereafter with Au | With cage | 120 |
| With rolling elements only ion-plated with Ni, then with Cu, thereafter with Ag | None | 200 |
| With rolling elements only ion-plated with Ni, then with Cu, thereafter with Ag | With cage | 250 |

The type of the bearings used for the experiment and the test conditions are as follows.

| Type of bearings: | No. 626 |
| --- | --- |
| Test conditions: | |
| Temperature | room temperature |
| Pressure | $1 \times 10^{-5}$ torr or lower |
| Rotation | 200 r.p.m. |
| Thrust load | 15 kg |

The foregoing results indicate that the anti-friction bearings embodying the invention have an exceedingly longer life than anti-friction bearings with the rolling elements coated with gold or silver by the conventional ion plating method. With anti-friction bearings coated by the conventional ion plating method, it is known that the cage for retaining the rolling elements acts to wear and separate the coating during the rotation of the bearing, with the result that anti-friction bearings with no cage have a longer life than those having a cage, whereas the test result given in Table 3 reveals that with the anti-friction bearings of this invention, those having a cage rather have a longer life than those without any cage, quite contrary to what has heretofore been believed. This is attributable to the very feature of the invention that the coating layer of lubricating soft metal, i.e. gold or silver is bonded with high strength to the double intermediate layer 21, 22 of nickel and copper formed on the surface of the rolling element, such that the metal of the intermediate layer has a high solid solubility in the metal of each layer adjacent thereto.

As already described, the anti-friction bearing of this invention is characterized in that at least the rolling elements thereof are formed with a composite coating 2 over the surface, because the effective contact surface area involving lubrication is then much larger than when the composite coating 2 is formed on the race or cage and achieves a greatly improved lubricating efficiency. Additionally the coating is easier to form. Especially when the rolling element is a ball as described above, the portion of the ball in contact with the races changes during the rotation of the bearing due to the spinning action of the ball. This enables the entire surface of the ball to serve as an effective contact area, thus affording very high lubricity.

However, the part to be formed with the composite coating 2 is not limited to the rolling element 1, but such a composite coating may be provided similarly over the raceways of the inner and outer rings 3 and 4. Table 4 shows the results of another experiment in which a bearing so coated was tested for serviceability in comparison with other bearings.

TABLE 4

| Kind of specimen | Life ratio |
| --- | --- |
| Anti-friction bearing of the invention with rolling elements ion-plated with Ni, then with Cu, thereafter with Ag | 19 |
| Anti-friction bearing of the invention with rolling elements and inner and outer rings ion-plated with Ni, the with Cu, thereafter with Ag | 18 |
| Unplated usual anti-friction bearing | 1 |

The type of the bearings used for the experiment and the test conditions are as follows.

| Type of bearings: | Ball bearing No. 727 |
| --- | --- |
| Test conditions: | |
| Temperature | Room temperature |
| Pressure | $1 \times 10^{-5}$ torr or lower |
| Rotation | 100 r.p.m. |
| Thrust load | 6 kg |
| Radial load | 4.6 kg |

The test results given in Table 4 indicate that the ball bearing in which the inner and outer raceways, like the balls, are coated with a silver layer has nearly the same long life as one in which the rolling elements alone are coated.

Figure 4:
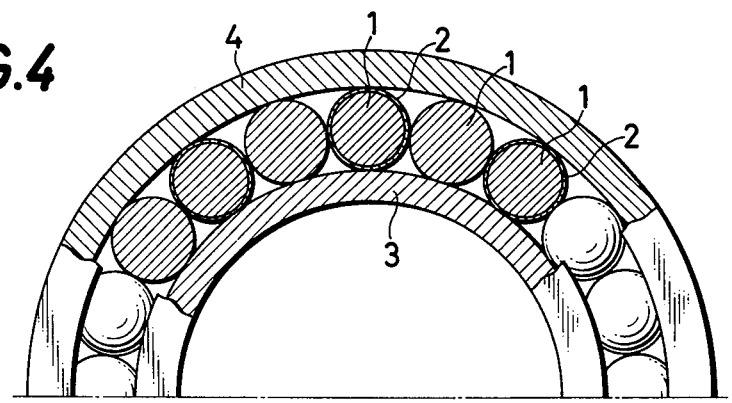

Although all the rolling elements 1 of each embodiment described above for supporting the bearing load are formed with the intermediate nickel and copper layers 21 and 22 and the uppermost gold or silver layer 23 covering the layer 22, every other ball 1 may be formed with the coating 2 as seen in FIG. 4, in the case of bearings of the type including no cage, for example in ball bearings. Table 5 shows that the bearing so coated has a longer life than one in which all the balls 1 have the coating 2.

In this case, the balls 1 having the coating 2 are diametrically larger than the uncoated balls 1 by an amount corresponding to the thickness of the coating 2. The coated balls 1 support the bearing load, while the uncoated balls serve as spacers.

TABLE 5

| Kind of specimen | Life ratio |
| --- | --- |
| With all balls ion-plated with Ni, then with copper, thereafter with Ag (ball bearing No. 626) | 5 |
| With every other ball ion-plated with Ni, then Cu, thereafter with Ag (ball bearing No. 626) | 12 |
| Test conditions: | |
| Temperature  Room temperature | |
| Pressure  $1 \times 10^{-5}$ torr or lower | |
| Rotation  3,200 r.p.m. | |
| Thrust load  15 kg | |

Although the embodiments described above are ball bearings, the invention is also useful for anti-friction bearings of other types, such as cylindrical roller bearings, tapered roller bearings and spherical roller bearings.

According to the invention described above, there is provided an anti-friction bearing in which, of the metal components thereof to be subjected to rolling friction or sliding friction, at least every other rolling element 1 is ion-plated with nickel and then with copper to form intermediate nickel and copper layers 21 and 22 and is further ion-coated with gold or silver to form an uppermost layer 23 over the copper layer 22, the solid solubility of the metal of each intermediate layer in each adjacent metal being higher than the solid solubility of gold or silver in the metal material of the rolling element 1. As a result, the gold or silver layer 23 can be formed over the rolling element 1 with high adhesive strength, with the nickel and copper layers 21 and 22 interposed therebetween, so that the gold or silver layer 23 can be held to the rolling element 1 over a prolonged period of time despite the rotation of the bearing. This gives a greatly prolonged life to the bearing.

Whereas it has been thought that the cage acts to promote the separation of the coating from the rolling element, the cage, if used in the anti-friction bearing of this invention, produces no adverse effect on the gold or silver layer 23 but is rather allowed to fully perform its contemplated function, thus eliminating the necessity of forming a groove for the balls and reducing the number of assembly steps needed for fabrication.

Although nickel and copper are used for the intermediate layers 21 and 22 for covering the rolling element 1 with use of gold or silver as a lubricating soft metal for the uppermost layer according to the foregoing embodiments, the metals for the intermediate layers and the lubricating metal are not limited to these examples.

While the above embodiments include nickel and copper intermediate layers, the rolling element 1 may be ion-plated with a single intermediate layer, for example, of nickel and further ion-plated with gold or silver. The gold or silver layer can be formed with higher adhesive strength than heretofore possible.

What is claimed is:

1. An anti-friction bearing comprising metal components to be subjected to rolling friction or sliding friction, at least one of the rolling elements included in the metal components being coated with at least one intermediate metal layer by ion plating, the intermediate layer being coated by ion plating with an uppermost layer of a soft metal with lubricating property, the solid solubility of the metal of the intermediate layer in each metal adjacent thereto being higher than the solid solubility of the soft metal in the metal material of the rolling element metal, wherein the metal components are made of an iron alloy, and the rolling elements are coated with a lower intermediate layer of nickel and an upper intermediate layer of copper, the uppermost layer being made of gold or silver.

* * * * *